United States Patent
Tsujino (10) Patent No.: US 9,078,347 B2
(45) Date of Patent: Jul. 7, 2015

(54) ELECTRONIC COMPONENT HOUSING UNIT, ELECTRONIC MODULE, AND ELECTRONIC DEVICE

(75) Inventor: Mahiro Tsujino, Higashioumi (JP)

(73) Assignee: KYOCERA Corporation, Kyoto (JP)

( * ) Notice: Subject to any disclaimer, the term of this patent is extended or adjusted under 35 U.S.C. 154(b) by 166 days.

(21) Appl. No.: 13/813,222

(22) PCT Filed: Jul. 29, 2011

(86) PCT No.: PCT/JP2011/067495
§ 371 (c)(1),
(2), (4) Date: Jan. 30, 2013

(87) PCT Pub. No.: WO2012/015040
PCT Pub. Date: Feb. 2, 2012

(65) Prior Publication Data
US 2013/0128467 A1    May 23, 2013

(30) Foreign Application Priority Data
Jul. 30, 2010    (JP) ................. 2010-172221

(51) Int. Cl.
*H05K 7/18*    (2006.01)
*H05K 5/02*    (2006.01)
(Continued)

(52) U.S. Cl.
CPC ............... *H05K 5/02* (2013.01); *G02B 6/4279* (2013.01); *H01L 23/057* (2013.01); *H01L 23/66* (2013.01); *H01L 2223/6627* (2013.01); *H01L 24/48* (2013.01); *H01L 2224/48091* (2013.01); *H01L 2224/48227* (2013.01);
(Continued)

(58) Field of Classification Search
USPC .................. 361/728–730, 799, 800, 816, 818
See application file for complete search history.

(56) References Cited

U.S. PATENT DOCUMENTS

| | | | | |
|---|---|---|---|---|
| 4,518,982 A | * | 5/1985 | Du Bois et al. ............... | 257/796 |
| 5,453,582 A | * | 9/1995 | Amano et al. ................ | 174/261 |

(Continued)

FOREIGN PATENT DOCUMENTS

| | | |
|---|---|---|
| CN | 176394 A | 4/2006 |
| CN | 1763924 A | 4/2006 |

(Continued)

OTHER PUBLICATIONS

International Search Report issued by Japanese Patent Office for International Application No. PCT/JP2011/067495.

(Continued)

*Primary Examiner* — Hung S Bui
(74) *Attorney, Agent, or Firm* — Procopio, Cory, Hargreaves & Savitch LLP (57) ABSTRACT

An electronic component housing unit includes: a substrate including a mounting region on which an electronic component is mounted; a connection conductor extending from a top face to a bottom face of the substrate, the connection conductor being electrically connected to the electronic component; a wiring conductor disposed on the bottom face of the substrate, one end of the wiring conductor being electrically connected to the connection conductor, another end of the wiring conductor being drawn out from a side face of the substrate; and a ground conductor disposed on the bottom face of the substrate, the ground conductor forming a coplanar line along with the wiring conductor. A bottom face of the wiring conductor is located above a bottom face of the ground conductor.

7 Claims, 10 Drawing Sheets

(51) Int. Cl.
- H01L 23/057 (2006.01)
- H01L 23/66 (2006.01)
- H01L 23/498 (2006.01)
- G02B 6/42 (2006.01)
- H01L 23/00 (2006.01)

(52) U.S. Cl.
CPC .. *H01L 2924/3011* (2013.01); *H01L 23/49811* (2013.01); *H01L 2223/6694* (2013.01)

(56) References Cited

U.S. PATENT DOCUMENTS

| | | | | |
|---|---|---|---|---|
| 6,847,275 | B2 * | 1/2005 | Sayanagi et al. | 333/247 |
| 6,933,450 | B2 * | 8/2005 | Okumichi et al. | 174/264 |
| 6,936,921 | B2 * | 8/2005 | Yoshida | 257/728 |
| 7,436,056 | B2 * | 10/2008 | Cheung et al. | 257/698 |
| 8,169,276 | B2 * | 5/2012 | Chang et al. | 333/33 |
| 8,531,023 | B2 * | 9/2013 | Shibuya et al. | 257/691 |
| 2005/0098348 | A1 | 5/2005 | Okumichi et al. | |
| 2012/0112344 | A1 * | 5/2012 | Shibuya et al. | 257/737 |
| 2013/0322036 | A1 * | 12/2013 | Tsujino | 361/752 |

FOREIGN PATENT DOCUMENTS

| | | |
|---|---|---|
| JP | H04-336702 A | 11/1992 |
| JP | H07-235811 A | 9/1995 |
| JP | 2003-152124 A | 5/2003 |
| JP | 2004-088067 A | 3/2004 |

OTHER PUBLICATIONS

Office Action dated Sep. 28, 2014 issued for counterpart Chinese application No. 201180022000.6.

* cited by examiner

ELECTRONIC COMPONENT HOUSING UNIT, ELECTRONIC MODULE, AND ELECTRONIC DEVICE

TECHNICAL FIELD

The present invention relates to an electronic component housing unit, an electronic module, and an electronic device.

BACKGROUND ART

Electronic components such as semiconductor elements for optical communication are mounted on, for example, an electronic component housing unit. The electronic component housing unit is attached to and mounted on a mounting board. For example, a package described in Patent Literature 1 can be used as such an electronic component housing unit.

The package described in Patent Literature 1 includes a package board (substrate) on which a semiconductor integrated circuit chip (electronic component) is mounted, a via-hole (connection conductor) that extends from a top face to a bottom face of the package board, a signal line metal film (wiring conductor) that is disposed on the bottom face of the package board, and a ground metal film (ground conductor) that is disposed on the bottom face of the package board and that is located with the signal line metal film interposed therebetween. The package described in Patent Literature 1 can be fixed to a mounting board for use.

However, when the package described in Patent Literature 1 is mounted on the mounting board, it may be difficult to perform impedance matching. Specifically, a large difference in ambient dielectric constant is caused between a region of the wiring conductor located just below the substrate and a region of the wiring conductor drawn out from the side face of the substrate. The reason is as follows. In the region just below the substrate, the substrate is located above and the mounting board is located below. That is, dielectrics are present on both sides in the vertical direction when seen from the wiring board. On the contrary, in the region drawn out from the side face of the substrate, the mounting board is located below. That is, a dielectric is present on only one side in the vertical direction when seen from the wiring board. Accordingly, it is difficult to perform impedance matching between the regions.

Patent Literature 1: Japanese Unexamined Patent Publication JP-A 4-336702 (1992)

SUMMARY OF INVENTION

An electronic component housing unit according to an aspect of the invention includes: a substrate including a mounting region on which an electronic component is mounted; a connection conductor extending from a top face to a bottom face of the substrate, the connection conductor being electrically connected to the electronic component; a wiring conductor disposed on the bottom face of the substrate, one end of the wiring conductor being electrically connected to the connection conductor, another end of the wiring conductor being drawn out from a side face of the substrate; and a ground conductor disposed on the bottom face of the substrate, the ground conductor forming a coplanar line along with the wiring conductor, a bottom face of the wiring conductor being located above a bottom face of the ground conductor.

DESCRIPTION OF EMBODIMENTS

Hereinafter, several embodiments of the invention will be described with reference to the accompanying drawings. In the following embodiments, an optical semiconductor element is used as an electronic component, but the invention is not limited to these examples and an integrated circuit or the like may be used.

Figure 1A:
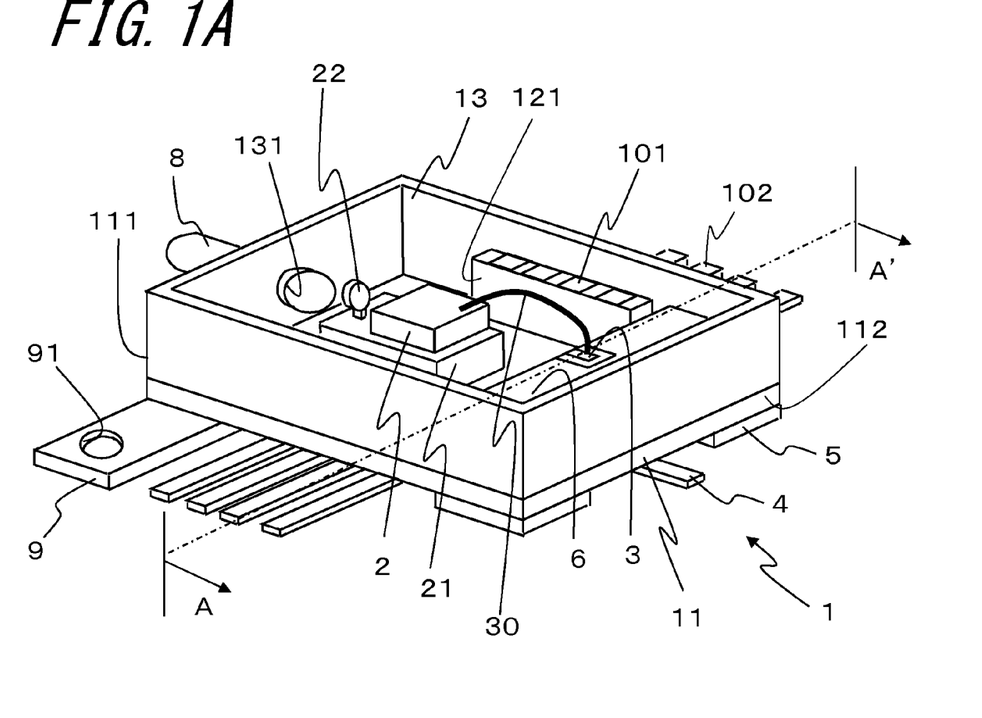
FIG. 1A is a perspective view illustrating an example of an electronic component housing unit according to a first embodiment of the invention.
Figure 1B:
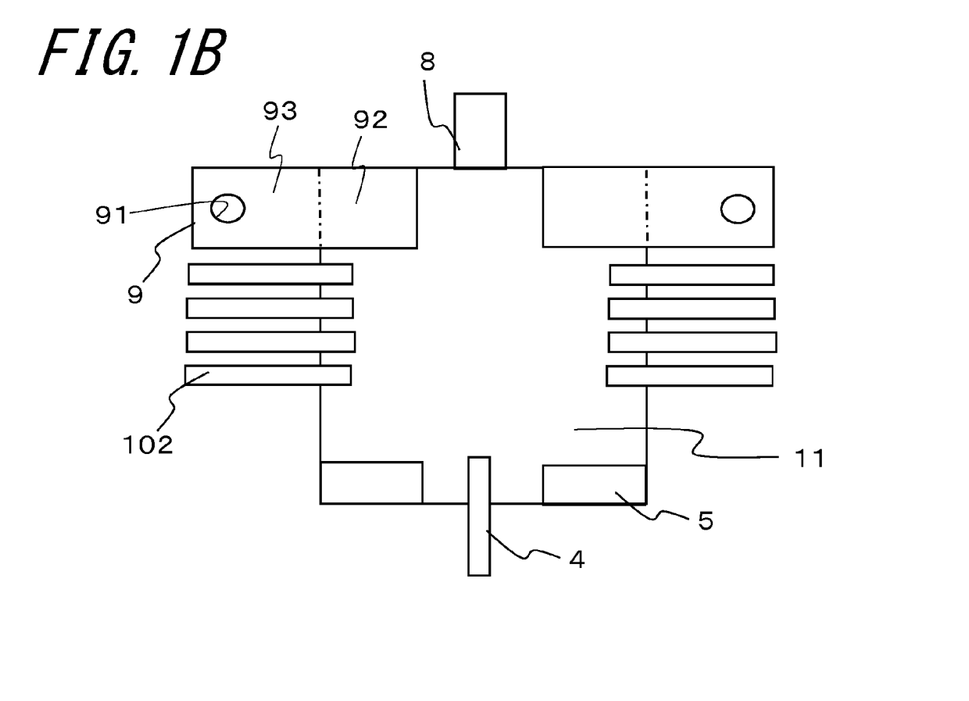
FIG. 1B is a bottom view of the electronic component housing unit shown in FIG. 1A.
Figure 2:
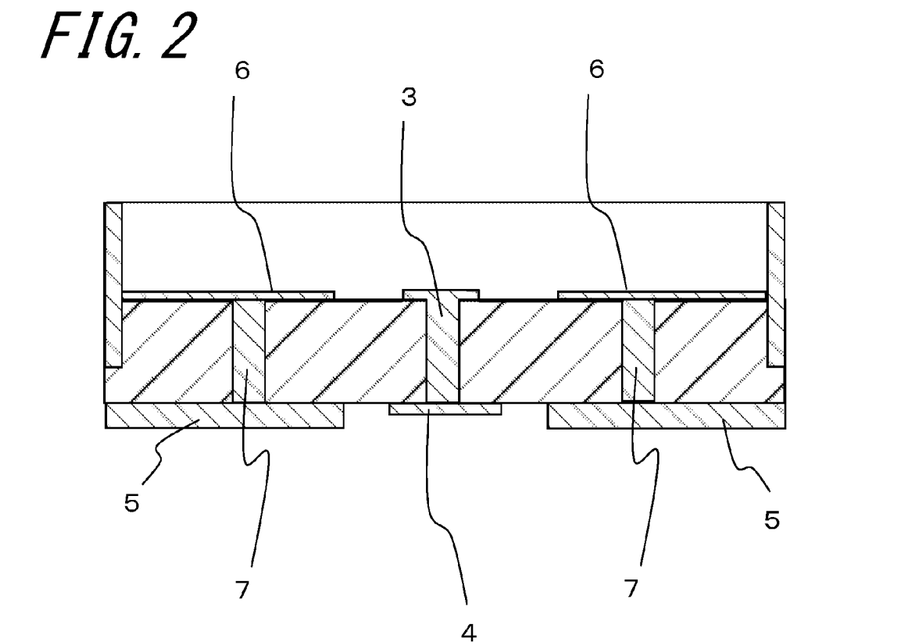
FIG. 2 is a cross-sectional view of the electronic component housing unit shown in FIG. 1 taken along line A-A'.

As shown in FIGS. 1A, 1B and FIG. 2, an electronic component housing unit (hereinafter, also referred to as an electronic component housing package or simply referred to as a package) 1 according to a first embodiment of the invention includes a substrate 11 having a mounting region on which an electronic component 2 is mounted; a frame 13 disposed on a top face of the substrate 11 to surround the mounting region; a connection conductor 3 extending from the top face to a bottom face of the substrate 11, the connection conductor 3 being electrically connected to the electronic component 2; a wiring conductor 4 disposed on the bottom face of the substrate 11, one end of the wiring conductor 4 being electrically connected to the connection conductor 3, another end of the wiring conductor 4 being drawn out from a side face of the substrate 11; an attachment member 9 disposed on the bottom face of the substrate 11, the attachment member 9 having an inner region 92 and an outer region 93, the inner region 92 overlapping the substrate 11 when seen from the bottom face of the substrate 11, the outer region 93 located outside a side face of the substrate 11 and having a hole 91 for attachment to a mounting board 15; and a ground conductor 5 disposed on the bottom face of the substrate 11, the ground conductor 5 forming a coplanar line along with the wiring conductor 4.

A bottom face of the wiring conductor 4 is located above a bottom face of the ground conductor 5. Specifically, a thickness of the ground conductor 5 in a direction perpendicular to the bottom face of the substrate 11 is larger than a thickness of the wiring conductor 4. Accordingly, it is possible to easily perform impedance matching when mounting the package 1 on the mounting board. Specifically, a dielectric constant around the region of the wiring conductor 4 located just below the substrate 11 can be made to be close to a dielectric constant around the region of the wiring conductor 4 drawn out from the side face of the substrate 11. This is because a gap between the region of the wiring conductor 4 located just below the substrate 11 and a mounting board can be made to be large, when the package 1 is mounted on the mounting board by bonding the region of the wiring conductor 4 drawn out from the side face of the substrate 11 to the mounting board with a connection member or the like. As a result, the dielectric constant around the region of the wiring conductor 4 located just below the substrate 11 can be made to be close to a dielectric constant of a case where a dielectric is present on only one side in the vertical direction when seen from the wiring conductor 4. Therefore, it is possible to easily perform impedance matching between the regions.

Specifically, when the wiring conductor 4 and the mounting board are formed of alumina ($Al_2O_3$) ceramics, relative permittivity of the wiring conductor 4 and the mounting board is about 10 and relative permittivity of air present in the gap therebetween is about 1. That is, around the region of the wiring conductor 4 drawn out from the side face of the substrate 11, a dielectric constant on the upper side of the wiring conductor 4 is about 1 and a dielectric constant on the lower side of the wiring conductor is about 10. Around the region of the wiring conductor 4 located just below the substrate 11, a gap in which the dielectric constant on the upper side of the wiring conductor 4 is about 10 and the dielectric constant on the lower side thereof is about 1 is disposed. The details of the thickness of the ground conductor 5 and the thickness of the wiring conductor 4 will be described later.

When mounting the package 1 on the mounting board 15, the ground conductor 5 earlier comes in contact with the mounting board 15 than the wiring conductor 4 does. Accordingly, it is possible to reduce a pressing force which the wiring conductor 4 receives from the mounting board 15. As a result, it is possible to suppress the deformation of the wiring conductor 4 due to the pressing force and thus to keep the signal transmission characteristic of the wiring conductor 4 good.

The substrate 11 in the package 1 according to the first embodiment includes a top face, a bottom face, and a plurality of side faces located between the top face and the bottom face. Specifically, the substrate 11 has a rectangular shape in a plan view, and a stepped portion 121 having terminal connecting conductors 101 described later is formed so as to come in contact with the inner circumferential surface of the frame 13. The substrate 11 includes a mounting region on which an electronic component 2 is mounted with a sub mount 21 interposed therebetween.

Since the electronic component 2 is mounted on the mounting region on the top face of the substrate 11, it is required that at least a portion of the substrate 11 on which the electronic component 2 is mounted have a high insulating property. The substrate 11 according to the first embodiment can be formed of a dielectric material such as alumina ($Al_2O_3$) ceramics, aluminum nitride (AlN) ceramics, or mullite ($3Al_2O_3.2SiO_2$) ceramics.

The frame 13 in the first embodiment is located on the top face of the substrate 11 to surround the mounting region. The frame 13 can be formed of a dielectric material, similarly to the substrate 11. The frame 13 may be formed of a metal member such as iron (Fe), copper (Cu), nickel (Ni), chromium (Cr), cobalt (Co), or tungsten (W) or alloys of these metals. The frame 13 has a plurality of side faces and has a through-hole 131 opened to an outer circumferential surface and an inner circumferential surface of a first side face 111 which is one side face. The package 1 according to the first embodiment includes an optical fiber attachment portion 8 attached to the through-hole 131 of the frame 13. The optical fiber attachment portion 8 in the first embodiment is a cylindrical member. The optical fiber attachment portion 8 is fixed to the frame 13 so that one end thereof is located inside the frame 13 and the other end thereof is located outside the frame 13. By fixing an optical fiber 23 by the use of the optical fiber attachment portion 8, it is possible to achieve the positioning of the optical fiber 23. When an optical semiconductor element is used as the electronic component 2, light can be transmitted between the optical semiconductor element and the optical fiber 23 by fixing the optical fiber 23 to a hollow portion of the optical fiber attachment portion 8 having a cylindrical shape. It is preferable that the optical fiber attachment portion 8 has at least sufficient strength to fix the optical fiber 23 thereto. Specifically, the optical fiber attachment portion can be formed of a metal material such as iron, copper, nickel, chromium, cobalt, or tungsten. The frame 13 and the substrate 11 may separately be formed or may be integrally formed.

The connection conductor 3 in the first embodiment extends from the top face to the bottom face of the substrate 11. The connection conductor 3 has a function of transmitting an electrical signal emitted from the electronic component 2 from the top face to the bottom face of the substrate 11 and a function of transmitting an electrical signal inputted from the outside from the bottom face to the top face of the substrate 11. One end of the connection conductor 3 is exposed from the top face of the substrate 11. The connection conductor 3 and the electronic component 2 are electrically connected to each other via a wiring disposed on the top face of the substrate 11. A representative connection method of such electrical connection is a wire bonding 30. The other end of the connection conductor 3 is exposed from the bottom face of the substrate 11.

The connection conductor 3 can be formed of a metal material such as tungsten, molybdenum (Mo), or manganese (Mn). An example of the method of forming the connection conductor 3 is a method of forming a through-hole penetrating the substrate 11 from the top face to the bottom face and disposing a metal paste in the through-hole. A known suction method or the like can be used as the method of disposing a metal paste in the through-hole. The connection conductor 3 may be formed so as to fill the entire inside of the through hole with a metal material. The metal material may be disposed so as to cover the inner surface of the through-hole and so as to form a cavity on an inner circumferential side thereof.

The wiring conductor 4 is disposed on the bottom face of the substrate 11. In the package 1 according to the first embodiment, a strip-like metal member is used as the wiring conductor 4. One end of the wiring conductor 4 is electrically connected to the connection conductor 3 and the other end of the wiring conductor 4 is drawn out from the substrate 11 from the second side face 112 which is one side face of the substrate 11. The wiring conductor 4 is formed of a metal material such as copper. The attachment of the wiring conductor 4 to the bottom face of the substrate 11 is performed by connecting the connection conductor 3 and the wiring conductor 4 to each other via a connection member or the like.

The package 1 in this example further includes an inner ground conductor 6 disposed on the top face of the substrate 11. The inner ground conductor 6 is disposed on the top face of the substrate 11 so as to surround one end of the connection conductor 3. A predetermined gap is secured between the connection conductor 3 and the inner ground conductor 6 so as not to short-circuit the connection conductor 3 and the inner ground conductor 6. The inner ground conductor 6 can be formed, for example, using a metallization method. The inner ground conductor 6 is formed of a metal material such as tungsten, molybdenum, or manganese. The inner ground conductor 6 is disposed to reduce dielectric loss when transmitting a high-frequency signal via the connection conductor 3.

The package 1 in this example includes a ground conductor 5 (outer ground conductor 5) disposed on the bottom face of the substrate 11. In this example, a strip-like metal plate is used as the outer ground conductor 5. The outer ground conductor 5 is disposed at two positions on the bottom face of the substrate 11 with the connection conductor 4 interposed therebetween. A predetermined gap is secured between the outer ground conductor 5 and the wiring conductor 4 so as not to electrically short-circuit the outer ground conductor 5 and the wiring conductor 4 to each other. Accordingly, the outer ground conductor 5 forms a coplanar line along with the wiring conductor 4. A member having excellent conductivity is preferably used as the outer ground conductor 5 and has only to be formed of, for example, the same metal material as the wiring conductor 4. The attachment of the outer ground conductor 5 to the bottom face of the substrate 11 is carried out by bonding a ground connecting conductor 7 described later and the outer ground conductor 5 via a connection member or the like.

Preferably, a modulus of elasticity of the outer ground conductor 5 is larger than a modulus of elasticity of the wiring conductor 4. Accordingly, when the pressing force is applied to both the wiring conductor 4 and the outer ground conductor 5, the pressing force can be easily concentrated on the outer ground conductor 5. As a result, since the deformation of the wiring conductor 4 can be suppressed, it is possible to suppress a decrease in signal transmission characteristics.

The package 1 of this example includes a ground connecting conductor 7 that extends from the top face to the bottom face of the substrate 11 and that electrically connects the inner ground conductor 6 and the outer ground conductor 5 to each other. Specifically, the ground connecting conductor 7 extends from the top face to the bottom face of the substrate 11 at two positions to correspond to two outer ground conductors 5 and two inner ground conductors 6 and is disposed with the connection conductor 3 interposed therebetween. A predetermined gap is secured between the ground connecting conductor 7 and the connection conductor 3 so as not to short-circuit these conductors. One end of the ground connecting conductor 7 is exposed from the top face of the substrate 11 and the other end thereof is exposed from the bottom face of the substrate 11.

The method of forming the ground connecting conductor 7 can employ a method of forming a through-hole penetrating the substrate 11 from the top face to the bottom face and disposing a metal paste in the through-hole, similarly to the connection conductor 3. The term "ground" in the inner ground conductor 6, the outer ground conductor 5, and the ground connecting conductor 7 means electrical connection to an external reference potential (not shown) as a so-called earth potential, and the potential as the reference potential is not necessarily 0 V.

The package 1 of this example includes a plurality of screw fixing portions 9 as a mounting member disposed on the bottom face of the substrate 11. Each screw fixing portion 9 includes an inner region 92 that is disposed on the bottom face of the substrate 11 and that overlaps the substrate 11 when seen from the bottom face of the substrate 11; and an outer region 93 that is located outside the side face of the substrate 11. Each screw fixing portion 9 is a rectangular member and is provided with a hole 91 extending from one main surface of the outer region 93 to the other main surface thereof. By attaching the package 1 to a mounting board 15 described later using these screw fixing portions 9, it is possible to fix the package 1 to the mounting board 15.

The screw fixing portion 9 is formed of a metal plate of copper or the like. The attachment of the screw fixing portion 9 to the substrate 11 is carried out by forming a metal film on the bottom face of the substrate 11 through the use of a metallization method and attaching the metal film and the screw fixing portion 9 using a connection member or the like.

It is desirable that the thickness of the screw fixing portion 9 in the direction perpendicular to the bottom face of the substrate 11 is larger than the thickness of the wiring conductor 4 in the direction perpendicular to the bottom face of the substrate 11 and is equal to the thickness of the outer ground conductor 5 in the direction perpendicular to the bottom face of the substrate 11 in consideration of the stability of the electronic component housing package 1 when mounting the electronic component housing package 1 on the mounting board 15. Here, the term "equal" means that an error of an extent to be inevitable in manufacture may be included.

The package 1 of this example of this embodiment includes a plurality of terminal connecting conductors 101 drawn out from the top face of the stepped portion 121 in the substrate 11 to the bottom face of the substrate 11. Although not shown in the drawings, the terminal connecting conductors 101 are electrically connected to the electronic component 2, for example, by wire bonding.

A lead terminal 102 is a member electrically connecting the terminal connecting conductors 101 to an outer wiring. The lead terminal 102 is a strip-like member and a plurality of lead terminals 102 are arranged on the bottom face of the substrate 11 side by side. One end of each of the lead terminals 102 is connected to the end of each of the terminal connecting conductors 101 located on the bottom face of the substrate 11 and the other end thereof is drawn out from the side face of the substrate 11. The lead terminal 102 is formed of a metal material such as copper.

In general, the connection conductor 3 and the wiring conductor 4 are used to transmit a high-frequency signal, whereas the terminal connecting conductors 101 and the lead terminals 102 are used to supply power to the electronic component 2. The plurality of terminal connecting conductors 101 are arranged with a predetermined gap so as not to electrically short-circuit each other. The terminal connecting conductors 101 can be formed through the same method as forming the connection conductor 3.

Figure 3A:
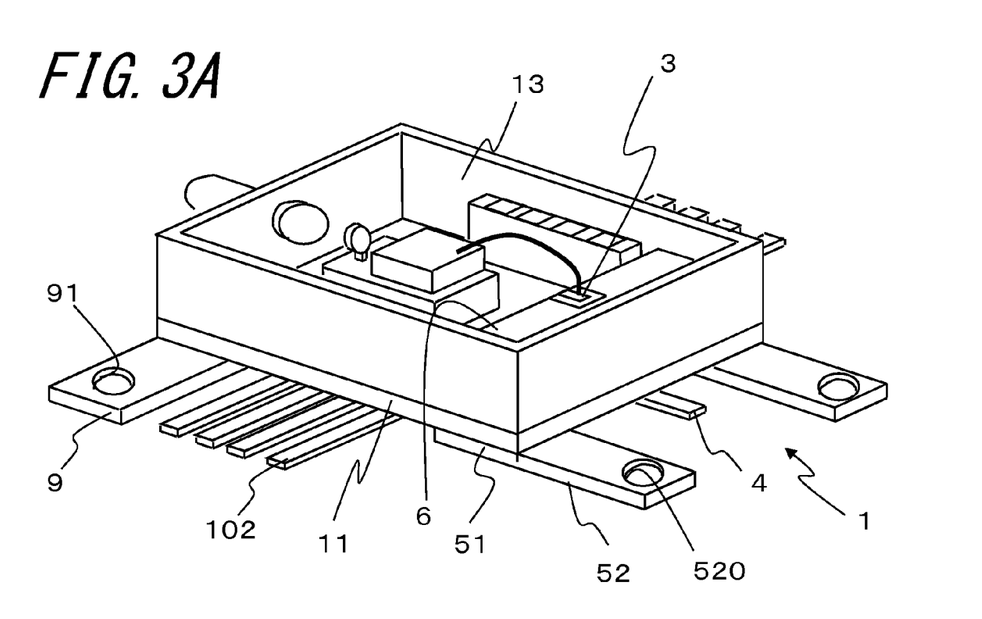
FIG. 3A is a perspective view illustrating a modified example of the electronic component housing unit according to the first embodiment of the invention.
Figure 3B:
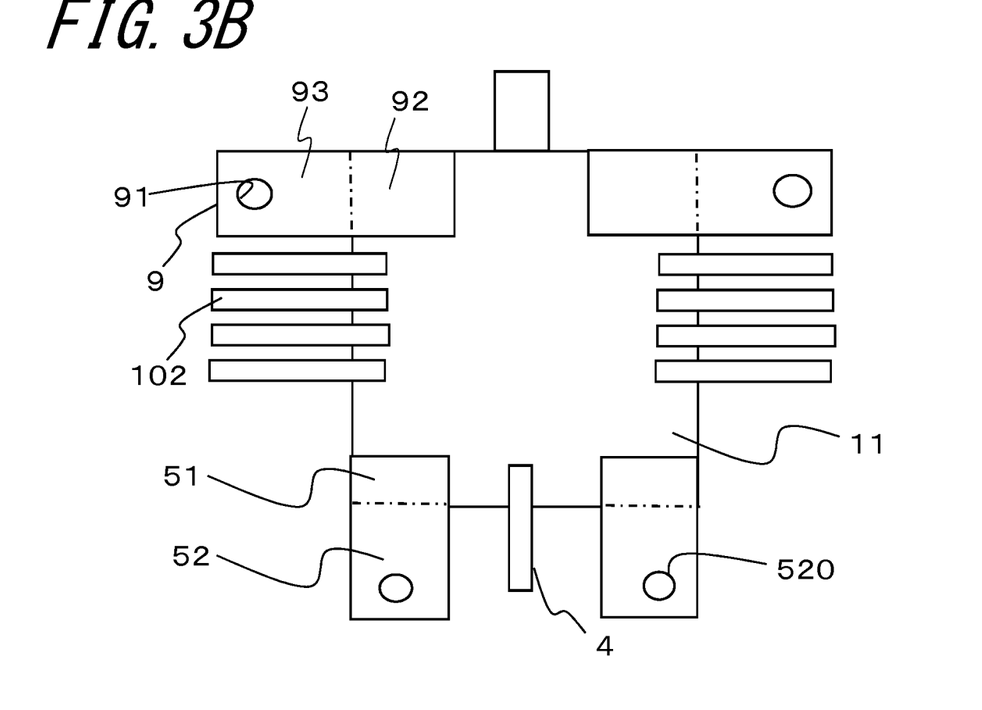
FIG. 3B is a bottom view of the electronic component housing unit shown in FIG. 3A.

As shown in FIGS. 3A and 3B, it is desirable that the outer ground conductor 5 includes a first region 51 overlapping the substrate 11 and a second region 52 located outside the substrate 11 when seen from the bottom face of the outer ground conductor 5. Accordingly, it is possible to reduce a variation in impedance of a coplanar line formed from just below the substrate 11 to the outside of the substrate 11 and constructed by the wiring conductor 4 and the outer ground conductor 5 and to improve transmission characteristics of a high-frequency signal.

As shown in FIGS. 3A and 3B, it is preferable that the outer ground conductor 5 has a hole 520 for attachment to the mounting board 15 through screwing in the second region 52. By screwing the package 1 to the mounting board 15 using the outer ground conductor 5 having the hole 520 and the screw fixing portions 9 having the hole 91, both can be fixed more strongly. Regarding the hole 520, a through-hole may extend from the top face to the bottom face of the outer ground conductor 5 or an opening may be provided at one end of the outer ground conductor 5 when seen from the bottom face of the outer ground conductor 5. In consideration of the influence of the hole 520 and the fastened screw on the parasitic capacitance between the outer ground conductor 5 and the wiring conductor 4, it is preferable that the hole 520 is provided to be opened on a side located on the opposite side of the side facing the wiring conductor 4 out of the sides of the outer ground conductor 5 when seen from the bottom face of the package 1. Accordingly, the variation in parasitic capacitance between the outer ground conductor 5 and the wiring conductor 4 is reduced. Therefore, it is possible to reduce the influence on the transmission characteristics of a high-frequency signal.

Figure 4:
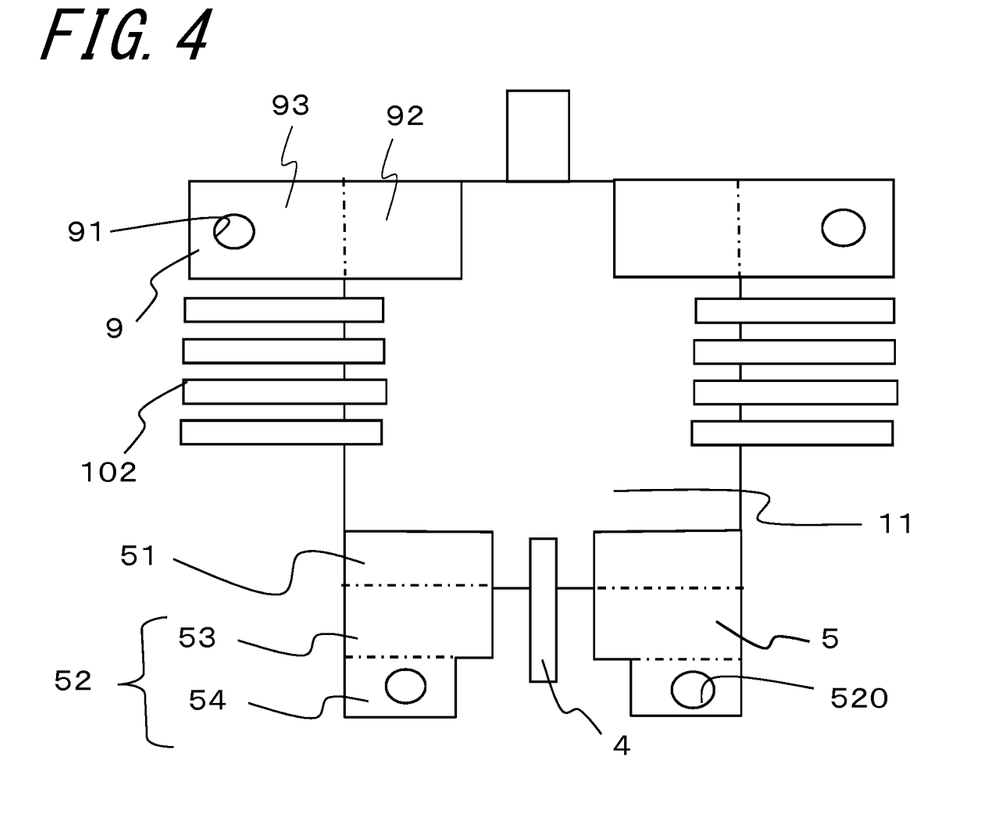
FIG. 4 is a bottom view illustrating a first modified example of the electronic component housing unit according to the first embodiment of the invention.

As shown in FIG. 4, it is desirable that the second region 52 of the outer ground conductor 5 includes a third region 53 adjacent to the first region 51 and a fourth region 54 located farther outside the substrate 11 than the third region 53 and the gap between the fourth region 54 and the wiring conductor 4 be larger than the gap between the third region 53 and the wiring conductor 4, when seen from the bottom face of the outer ground conductor 5. Accordingly, since the impedance in a transmission circuit constructed by the wiring conductor 4 and the outer ground conductor 5 can be changed in a stepwise fashion, it is possible to further improve the transmission characteristics. When the hole 520 is formed in the outer ground conductor 5, it is desirable that the hole is formed in the fourth region 54. Accordingly, it is possible to further reduce the pressing force applied to the wiring conductor 4 when performing the screwing using the hole 520. For example, when the gap between the third region 53 and the wiring conductor 4 is in a range of 500 to 700 μm, the gap between the fourth region 54 and the wiring conductor 4 can be set to a range of 1000 to 1200 μm.

Figure 5:
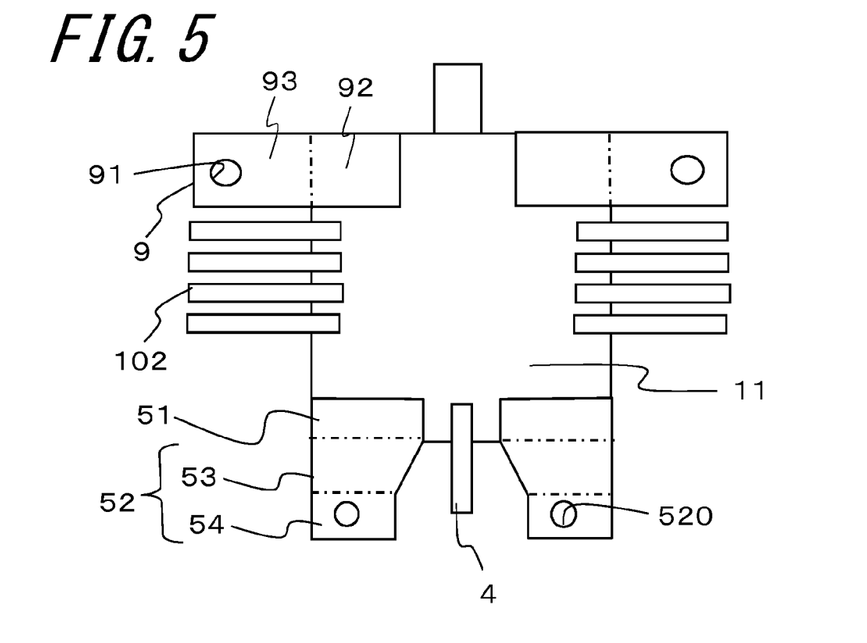
FIG. 5 is a bottom view illustrating a second modified example of the electronic component housing unit according to the first embodiment of the invention.

As shown in FIG. 5, it is desirable that as the third region 53 in the outer ground conductor 5 gets father from the substrate 11 when seen from the bottom face of the outer ground conductor 5, the gap between the third region and the wiring conductor 4 becomes larger. Accordingly, since the impedance in the transmission circuit constructed by the wiring conductor 4 and the outer ground conductor 5 can be more smoothly changed, it is possible to further improve the transmission characteristics of a high-frequency signal.

Figure 6:
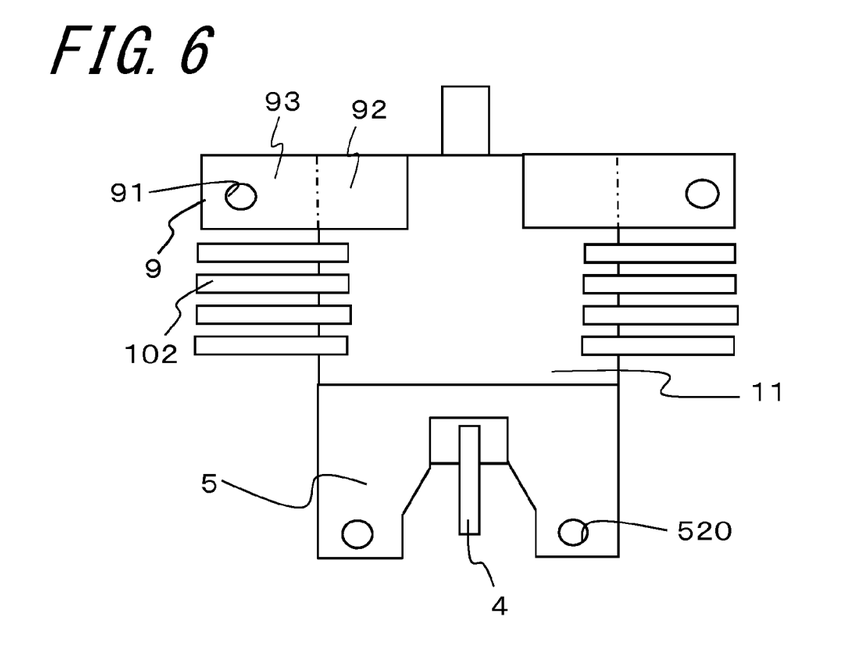
FIG. 6 is a bottom view illustrating a third modified example of the electronic component housing unit according to the first embodiment of the invention.

As shown in FIG. 6, it is preferable that two outer ground conductors 5 are integrally formed by connecting to each other, for example, on the bottom face of the substrate 11. In this case, the outer ground conductor 5 has a shape surrounding one end of the wiring conductor 4, for example, in three directions. By forming the outer ground conductors 5 integrally in this way, it is possible to improve the strength of the outer ground conductor 5 and to further reduce the potential difference between the outer ground conductors 5 on both sides of the wiring conductor 4. Accordingly, it is possible to further improve the reliability of a reference potential. As a result, it is possible to improve the transmission characteristics of a high-frequency signal.

Figure 7:
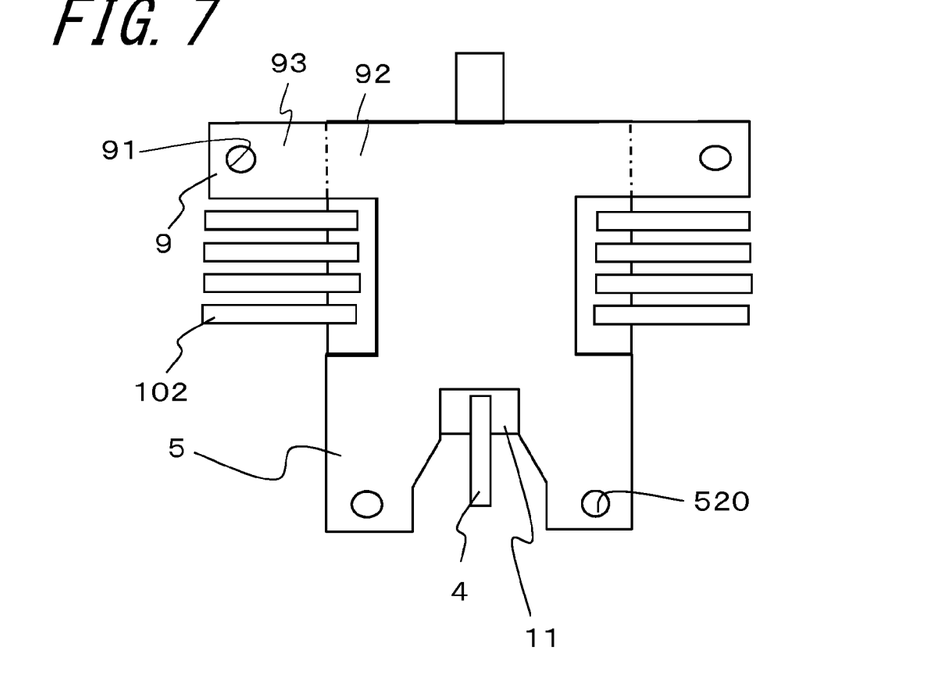
FIG. 7 is a bottom view illustrating a fourth modified example of the electronic component housing unit according to the first embodiment of the invention.

As shown in FIG. 7, it is preferable that the outer ground conductor 5 and the screw fixing portion 9 are integrally formed. Accordingly, it is possible to distribute the stress applied to the screw fixing portion 9 at the time of screwing to the outer ground conductor 5. Therefore, it is possible to stably perform the screwing using the screw fixing portion 9. As a result, it is possible to improve the reliability of the electronic component housing package 1. Since the outer ground conductor 5 and the screw fixing portion 9 are integrally formed, it is possible to reduce the number of parts.

An electronic component housing package 10 according to an example of a second embodiment of the invention will be described below. In the configuration of this example, members having the same functions as in the first embodiment will be denoted by the same reference numerals and detailed description thereof will be omitted.

Figure 8A:
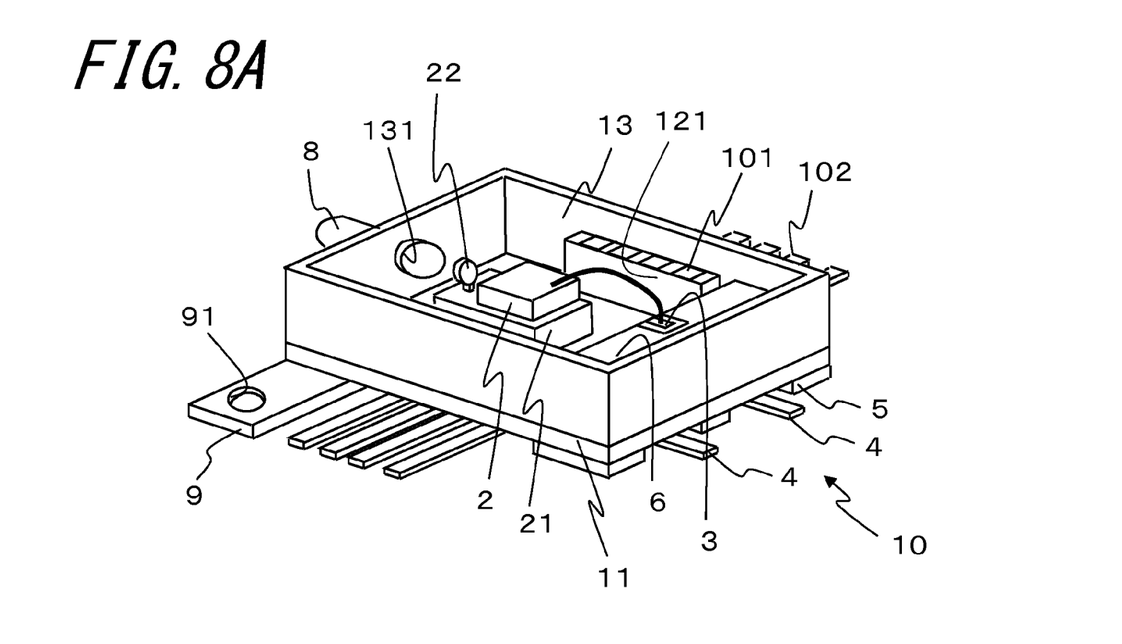
FIG. 8A is a perspective view illustrating an electronic component housing unit according to a second embodiment of the invention.
Figure 8B:
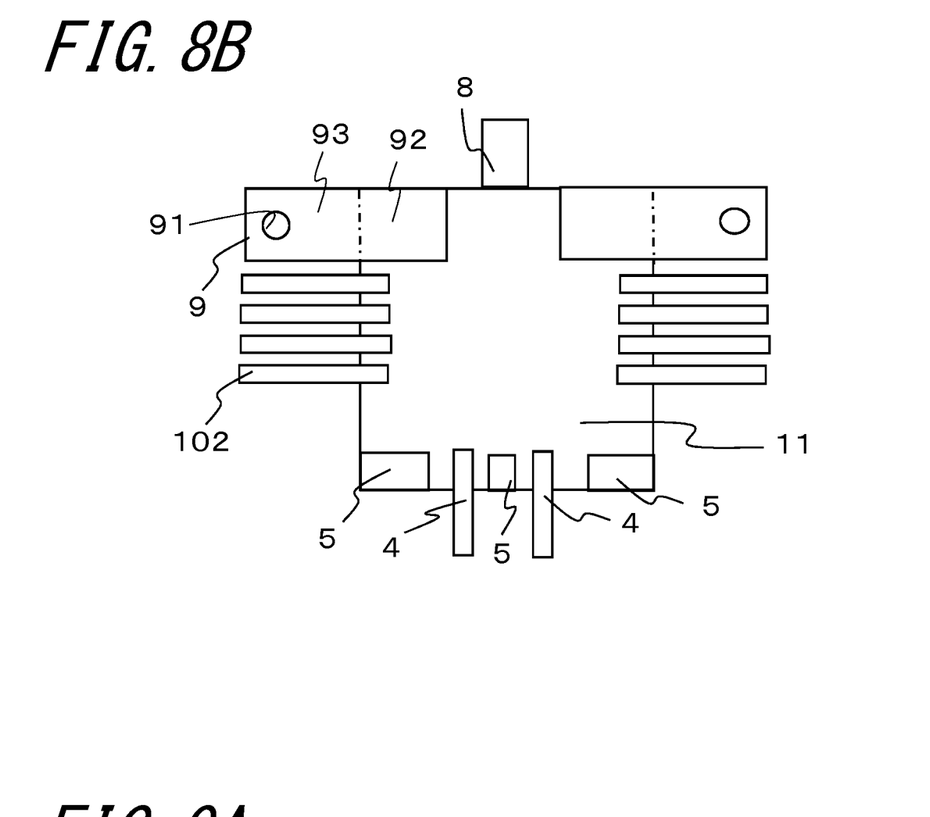
FIG. 8B is a bottom view of the electronic component housing unit shown in FIG. 8A.

As shown in FIGS. 8A and 8B, the electronic component housing package 10 according to the second embodiment includes a wiring conductor 4, similarly to the electronic component housing package 1 according to the first embodiment. Although a single wiring conductor 4 is disposed in the electronic component housing package 1 according to the first embodiment, a plurality of wiring conductors 4 are disposed in the electronic component housing package 10 according to this embodiment.

In this example, the outer ground conductors 5 are located with two wiring conductors 4 interposed therebetween, respectively. One outer ground conductor 5 is interposed between two wiring conductors 4. Accordingly, it is possible to reduce an electromagnetic influence between the wiring conductors 4.

Figure 9A:
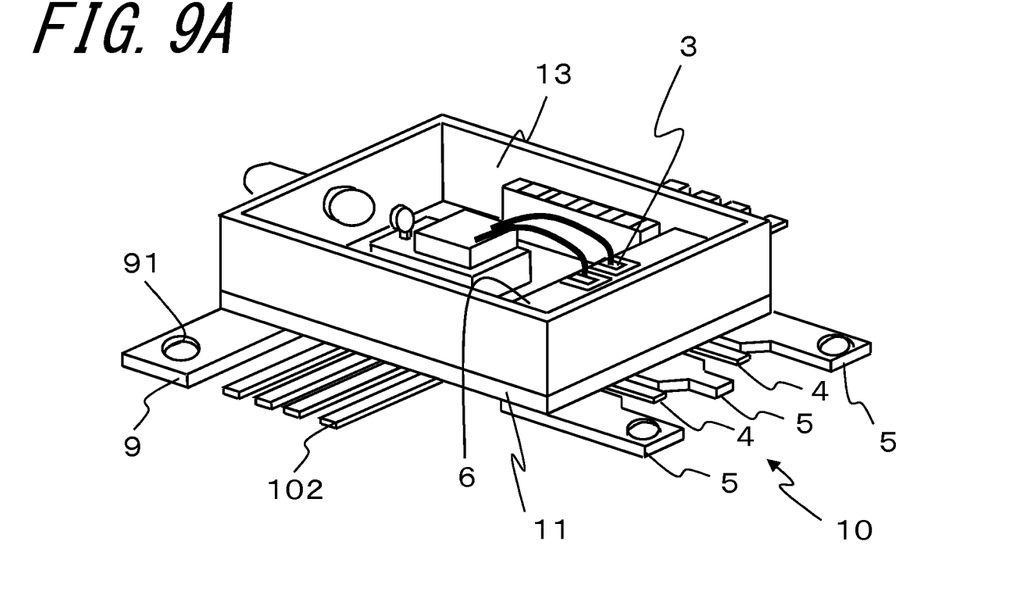
FIG. 9A is a perspective view illustrating a modified example of the electronic component housing unit according to the second embodiment of the invention.
Figure 9B:
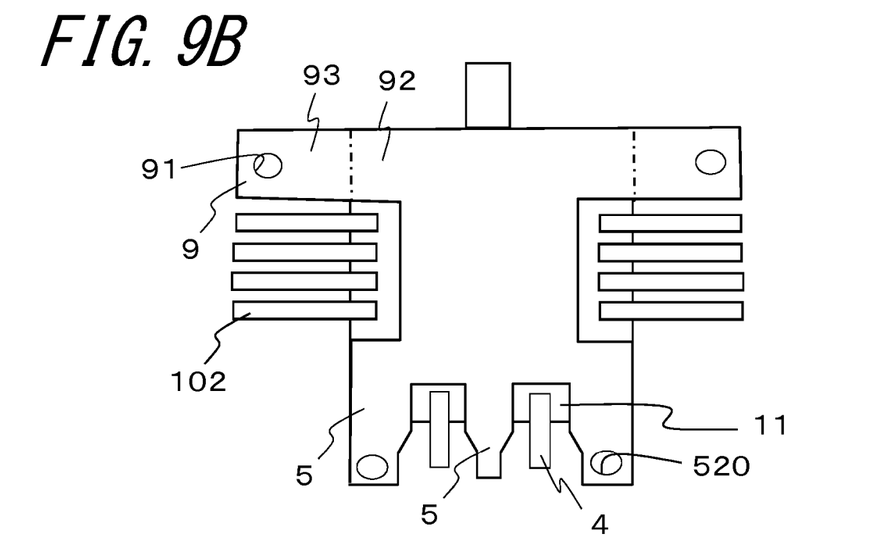
FIG. 9B is a cross-sectional view of the electronic component housing unit shown in FIG. 9A.

As shown in FIGS. 9A and 9B, it is preferable that the outer ground conductors 5 located with the wiring conductor 4 interposed therebetween and the outer ground conductors 5 interposed between the wiring conductors 4 are integrally formed by connecting to each other, for example, on the bottom face of the substrate 11. Accordingly, it is possible to improve the strength of the outer ground conductors 5 resistant to the pressure and to further reduce the potential difference between the outer ground conductors 5 located with the wiring conductor 4 interposed therebetween and the outer ground conductor 5 interposed between the wiring conductor 4, thereby improving the transmission characteristics of a high-frequency signal.

In the electronic component housing package 10 of this example, the outer ground conductors 5 and the screw fixing portions 9 as the mounting member can be appropriately changed in shape, similarly to the outer ground conductor 5 and the screw fixing portion 9 in the example of the first embodiment.

Figure 10:
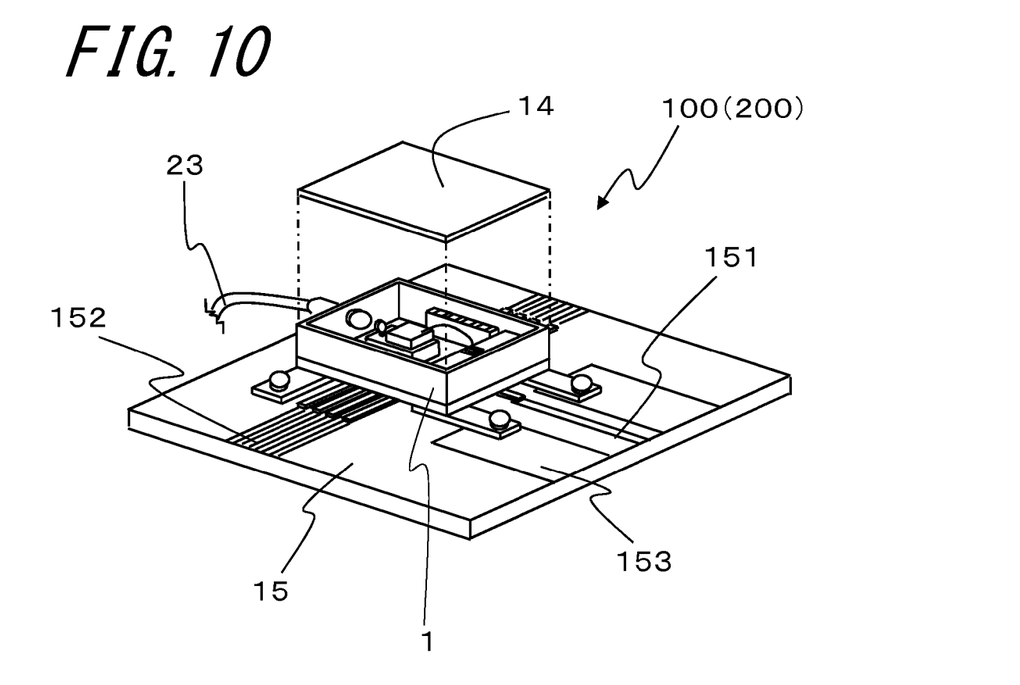
FIG. 10 is an exploded perspective view illustrating an example of an electronic module and an electronic device according to an embodiment of the invention.
Figure 11:
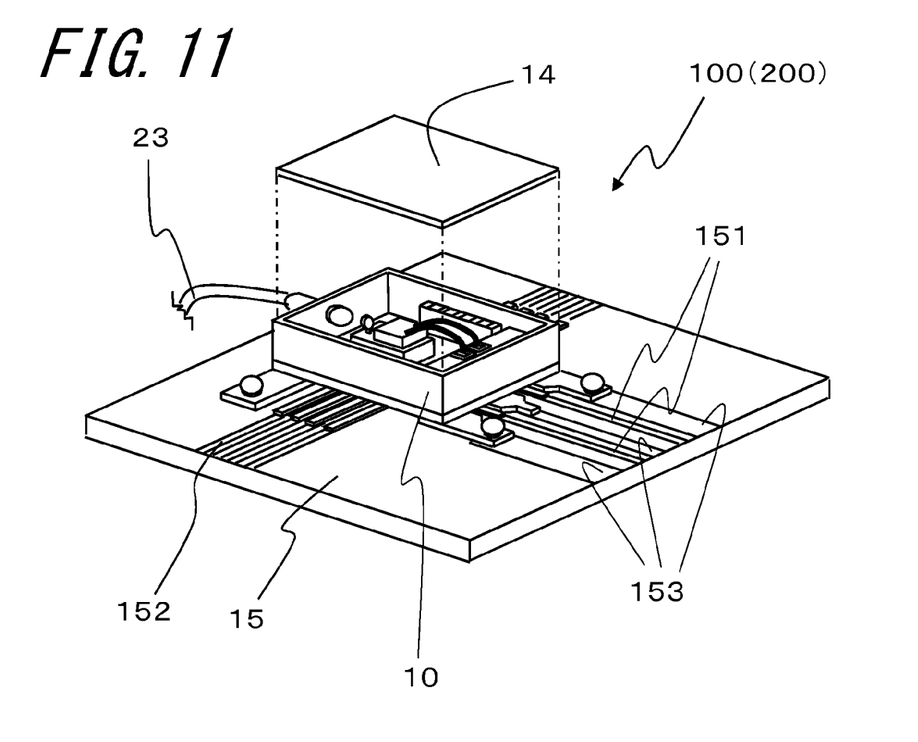
FIG. 11 is an exploded perspective view illustrating an example of an electronic module and an electronic device according to another embodiment of the invention.

An electronic module 100 according to an example of an embodiment of the invention includes an electronic component 2 housed in the packages 1 and 10 according to the above-mentioned embodiments, as shown in FIGS. 10 and 11. The optical semiconductor element as the electronic component 2 in this example is mounted on an electronic component mounting region with a sub mount 21 interposed therebetween. The optical semiconductor element has a function of converting an electrical signal into an optical signal or a function of converting an optical signal into an electrical signal. Examples of the optical semiconductor element include a laser diode and a photodiode. The optical semiconductor element may be mounted directly on the electronic component mounting region, but is preferably mounted on the sub mount 21. This is because the level of the optical semiconductor element can be adjusted by the use of the sub mount 21 and it is thus possible to improve the optical coupling accuracy to an optical fiber 23.

The electronic module 100 of this example includes an optical fiber 23 installed in the optical fiber attachment portion 8. The optical fiber 23 is inserted into the optical fiber attachment portion 8 from the outside of the substrate 11. The optical fiber 23 is optically coupled to the optical semiconductor element.

The electronic module 100 of this example includes a light-transmitting member 22. The light-transmitting member 22 is disposed on the top face of the sub mount 21 and is located between the optical fiber 23 and the optical semiconductor element. The light-transmitting member 22 has a function of collecting light emitted from the optical semiconductor element on the optical fiber 23 or a function of collecting light emitted from the optical fiber 23 on the optical semiconductor element. The light-transmission mentioned herein does not necessarily mean 100% light transmittance. For example, 80% light transmittance will do. The light-transmitting member 22 is, for example, a lens formed of glass or plastic.

The electronic module 100 of this example includes a cover member 14. The cover member 14 is a rectangular plate member and is disposed on the top face of the frame 13. By bonding the cover member 14 to the frame 13, the optical semiconductor element is air-tightly sealed. Accordingly, it is possible to improve the reliability of the optical semiconductor element. For example, the cover member 14 is formed of a dielectric material such as alumina ceramics, aluminum nitride ceramics, or mullite ceramics; or a metal material such as iron, nickel, chromium, cobalt, or tungsten.

An electronic device 200 according to an example of an embodiment of the invention includes an electronic module 100 and a mounting board 15 on which the electronic module 100 is mounted.

The mounting board 15 in the example of this embodiment is formed of a dielectric material such as resin or ceramics. A first circuit pattern 151, a second circuit pattern 152, and a ground pattern 153 are formed on the top face of the mounting board 15. The first circuit pattern 151, the second circuit pattern 152, and the ground pattern 153 are obtained, for example, by sintering a metal paste including molybdenum or manganese as a raw material. The electronic component housing package 1 or 10 is mounted on the mounting board 15 so that the first circuit pattern 151, the wiring conductor 4, the second circuit pattern 152 and the lead terminal 102, the ground pattern 153, and the outer ground conductor 5 are electrically connected.

Figure 12:
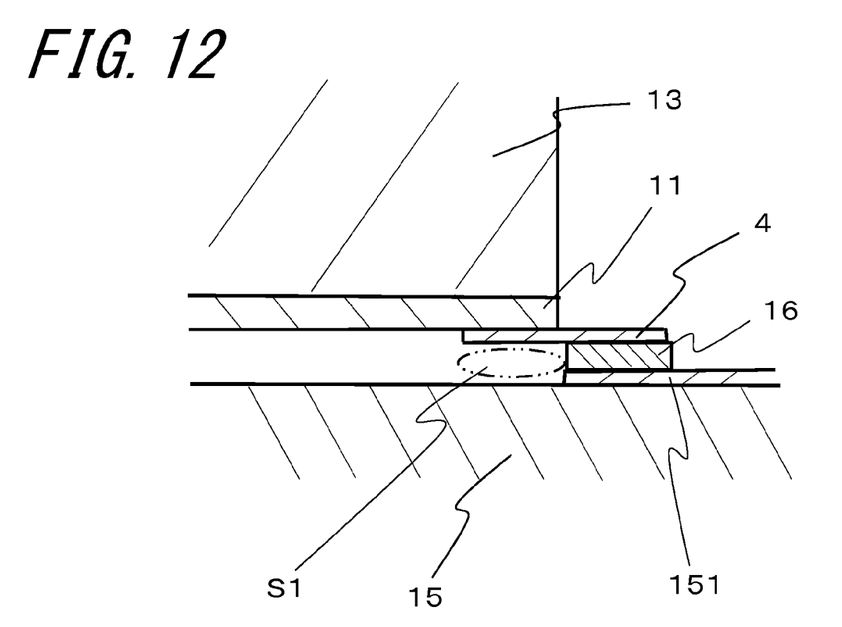
FIG. 12 is a cross-sectional view of the vicinity of a wiring conductor of the electronic device shown in FIGS. 10 and 11, which is taken along a direction of a coplanar line.
Figure 13:
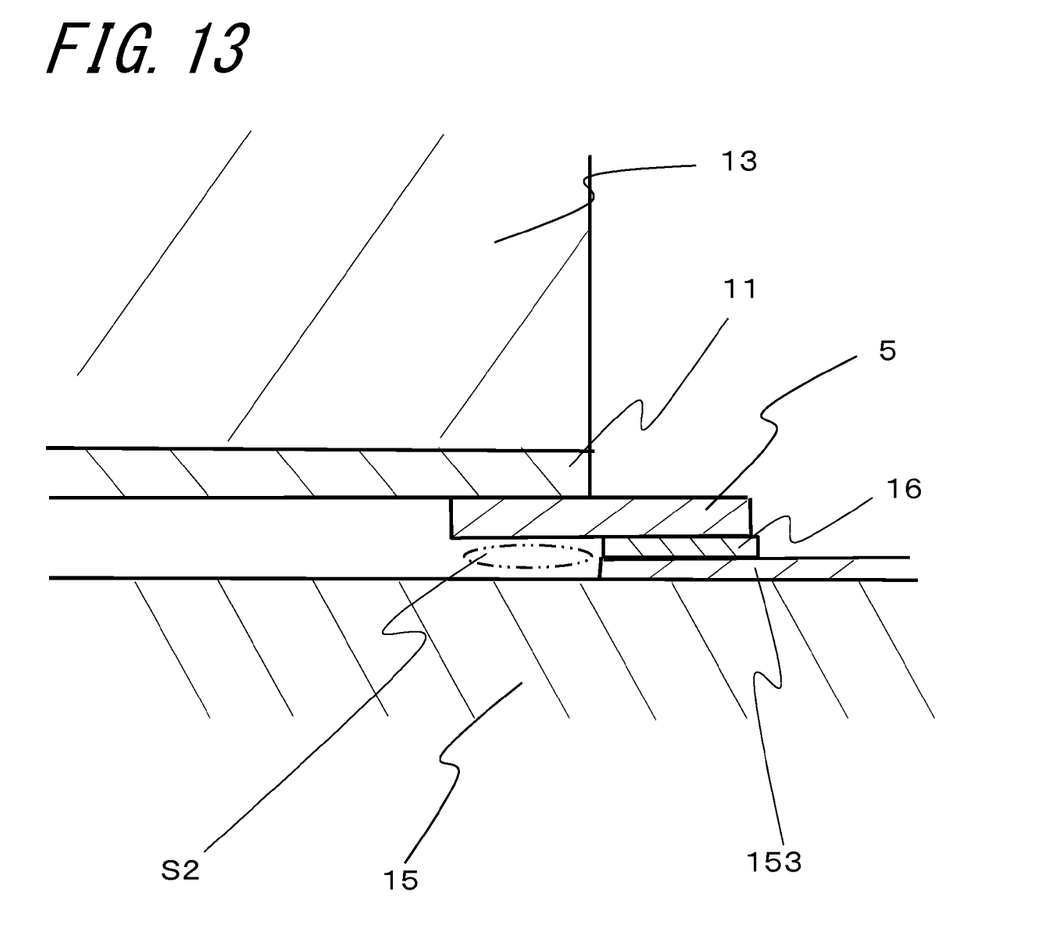
FIG. 13 is a cross-sectional view of the vicinity of a ground conductor of the electronic device shown in FIGS. 10 and 11, which is taken along a direction of a coplanar line.

Specifically, as shown in FIGS. 12 and 13, a connection member 16 is disposed between the top face of the first circuit pattern 151 and the bottom face of the region of the wiring conductor 4 drawn out from the side face of the substrate 11, between the top face of the second circuit pattern 152 and the bottom face of the lead terminal 102, and between the top face of the ground pattern 153 and the bottom face of the outer ground conductor 5. Examples of the connection member 16 include SnAgCu solder, SnZnBi solder, SnCu solder, and SnAgInBi solder.

Since the bottom face of the wiring conductor 4 is located above the bottom face of the outer ground conductor 5, the gap S1 between the region of the wiring conductor 4 located just below the substrate 11 and the mounting board 15 can be made to increase. That is, compared with the case where the outer ground conductor 5 and the wiring conductor 4 have the same level, the gap between the wiring conductor 4 and the mounting board 15 can be made to increase in the vertical direction by the difference in level between the outer ground conductor 5 and the wiring conductor 4. That is, the electronic device 200 includes the electronic module 100 and the mounting board 15 on which the electronic module 100 is mounted, and the gap S1 between the region of the wiring conductor 4 located just below the substrate 11 and the mounting board 15 is larger than the gap S2 between the region of the outer ground conductor 5 located just below the substrate 11 and the mounting board 15.

Accordingly, it is possible to easily perform impedance matching when mounting the package 1, 10 on the mounting board 15. Specifically, since the gap S1 between the wiring conductor 4 and the mounting board 15 is made to be large in the vertical direction, the dielectric constant around the region of the wiring conductor 4 located just below the substrate 11 can be made to close to the dielectric constant around the region of the wiring conductor 4 drawn out from the side face of the substrate 11. Accordingly, it is easy to perform impedance matching between these regions.

An opening is formed in the mounting board 15 so as to succeed to the hole 91 of the attachment member 9. By fitting a screw through the hole 91 and the opening, it is possible to strongly fix the electronic component housing package 1 or 10 to the mounting board 15.

In the electronic device 200 shown in FIG. 11, a dimensional example when a high-frequency signal with a frequency of about 10 to 40 GHz is transmitted will be described below. The width of two wiring conductors 4 is set to 150 μm, the width of the region of the outer ground conductor 5 located between the two wiring conductors 4 and located just below the side face of the substrate 11 is set to 400 μm, and the gaps between this region and the two wiring conductors 4 are set to 900 μm.

In this case, the thickness of the wiring conductor 4 can be set to, for example, a range of 100 to 500 μm and the thickness of the outer ground conductor 5 is determined so that the magnitude in the height direction of the gap S1 is accordingly equal to a desired size. As the magnitude in the height direction of the gap S1 is set to be larger, the dielectric constant of the region of the wiring conductor 4 located just below the substrate 11 and the dielectric constant of the region drawn out from the side face of the substrate 11 can be made to be closer to each other. However, when the gap S1 is set to be excessively large, a high-frequency signal may resonate in the gap S1. Therefore, under the above-mentioned conditions, the magnitude in the height direction of the gap S1 is preferably set to a range of 100 to 500 μm.

The invention is not limited to the above-mentioned examples of the embodiments, but may be modified or combined in various forms without departing from the concept of the invention.

EXAMPLE

As an example, the electronic component housing unit 10, the electronic module 100, and the electronic device 200 according to the second embodiment of the invention were manufactured and evaluated. The manufactured electronic device 200 was the electronic device 200 shown in FIG. 11.

The dimensions of the manufactured electronic device 200 were as follows. Two wiring conductors 4 had a width of 150 μm and a thickness of 100 μm. The outer ground conductor 5 has a thickness of 200 μm and the width of the region of the outer ground conductor 5 located between the two wiring conductors 4 and located just below the side face of the substrate 11 was 400 μm. The gaps between this region and the two wiring conductors 4 were 900 μm. The thicknesses of the first circuit pattern 151 and the ground pattern 153 were 20 µm. Regarding the thickness of the connection member 16, the thickness of the connection member 16 disposed between the wiring conductor 4 and the first circuit pattern 151 was 150 µm and the thickness of the connection member 16 disposed between the outer ground conductor 5 and the ground pattern 153 was 50 µm. That is, the magnitude in the height direction of the gap S1 was 170 µm.

High-frequency signals with frequencies of 10 GHz, 20 GHz, 30 GHz, and 40 GHz were inputted to the manufactured electronic device 200 and the magnitude of return loss was measured. As a comparative example, an electronic device was prepared which was different from the example only in the thickness of the wiring conductor 4 and the thickness of the connection member 16 disposed between the wiring conductor 4 and the first circuit pattern 151. Specifically, the thickness of the wiring conductor was 200 µm, and the thickness of the connection member disposed between the wiring conductor 4 and the first circuit pattern 151 was 50 µm. The same measurement was carried out on the electronic device according to the comparative example.

TABLE 1

Comparison of Return Loss by Frequency

|  | 10 GHz | 20 GHz | 30 GHz | 40 GHz |
| --- | --- | --- | --- | --- |
| Example | −28 dB | −30 dB | −22 dB | −25 dB |
| Comparative Example | −23 dB | −21 dB | −16 dB | −16 dB |

As shown in Table 1, the return loss when a high-frequency signal of 10 GHz is made to flow was −28 dB in the example and was −23 dB in the comparative example. The return loss when a high-frequency signal of 20 GHz is made to flow was −30 dB in the example and was −21 dB in the comparative example. The return loss when a high-frequency signal of 30 GHz is made to flow was −22 dB in the example and was −16 dB in the comparative example. The return loss when a high-frequency signal of 40 GHz is made to flow was −25 dB in the example and was −16 dB in the comparative example. At any frequency, the return loss in the example was smaller than that in the comparative example. This was because the impedance matching in the example was better made than that in the comparative example. As described above, it could be seen that it was possible to easily perform impedance matching by employing the electronic device 200 according to the invention.

Reference Signs List 1, 10: Electronic component housing unit (Electronic component housing package, Package)
  100: Electronic module
  200: Electronic device
  2: Electronic component
  3: Connection conductor
  4: Wiring conductor
  5: Ground conductor (Outer ground conductor)
  51: First region
  52: Second region
  520: Hole
  53: Third region
  54: Fourth region
  9: Fixing portion (screw fixing portion)
  91: Hole
  11: Substrate
  13: Frame
  15: Mounting board

The invention claimed is:

1. An electronic component housing unit, comprising:
a substrate comprising a mounting region on which an electronic component is mounted;
a connection conductor extending from a top face to a bottom face of the substrate, the connection conductor being electrically connected to the electronic component;
a wiring conductor disposed on the bottom face of the substrate, one end of the wiring conductor being electrically connected to the connection conductor, another end of the wiring conductor being drawn out from a side face of the substrate; and
a ground conductor disposed on the bottom face of the substrate, the ground conductor forming a coplanar line along with the wiring conductor,
a bottom face of the wiring conductor being located above a bottom face of the ground conductor, and
a modulus of elasticity of the ground conductor being larger than a modulus of elasticity of the wiring conductor.

2. The electronic component housing unit according to claim 1, wherein the ground conductor comprises a first region overlapping the substrate when seen from the bottom face of the ground conductor, and a second region located outside a side face of the substrate.

3. The electronic component housing unit according to claim 2, wherein the ground conductor comprises a hole in the second region.

4. The electronic component housing unit according to claim 2, wherein the second region of the ground conductor comprises a third region adjacent to the first region and a fourth region located further outside the substrate than the third region when seen from the bottom face of the ground conductor, and a gap between the fourth region and the wiring conductor is larger than a gap between the third region and the wiring conductor.

5. The electronic component housing unit according to claim 4, wherein as the third region of the ground conductor gets farther from the substrate when seen from the bottom face of the ground conductor, a gap from the wiring conductor becomes larger.

6. An electronic module, comprising:
the electronic component housing unit according to claim 1; and
an electronic component mounted on the mounting region of the electronic component housing unit.

7. An electronic device, comprising:
the electronic module according to claim 6; and
a mounting board on which the electronic module is mounted.

* * * * *